(12) United States Patent
Jung et al.

(10) Patent No.: US 10,497,292 B2
(45) Date of Patent: Dec. 3, 2019

(54) FLEXIBLE COLOR FILTER SUBSTRATE AND FLEXIBLE LIGHT EMITTING DISPLAY APPARATUS INCLUDING THE SAME

(71) Applicant: LG DISPLAY CO., LTD., Seoul (KR)

(72) Inventors: Hyunju Jung, Incheon (KR); MiAe Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/045,141

(22) Filed: Jul. 25, 2018

(65) Prior Publication Data
US 2019/0066545 A1 Feb. 28, 2019

(30) Foreign Application Priority Data
Aug. 28, 2017 (KR) .................. 10-2017-0108732

(51) Int. Cl.
| | |
|---|---|
| *G09F 9/30* | (2006.01) |
| *G03F 7/00* | (2006.01) |
| *H01L 27/12* | (2006.01) |
| *G06F 1/16* | (2006.01) |
| *G09G 3/32* | (2016.01) |
| *G02B 5/20* | (2006.01) |

(52) U.S. Cl.
CPC .............. *G09F 9/301* (2013.01); *G02B 5/201* (2013.01); *G03F 7/0007* (2013.01); *G06F 1/1652* (2013.01); *G09G 3/32* (2013.01); *H01L 27/124* (2013.01)

(58) Field of Classification Search
CPC ........ G02B 5/201; G09F 9/301; G03F 7/0007
See application file for complete search history.

(56) References Cited

U.S. PATENT DOCUMENTS

2004/0090588 A1    5/2004  Kim et al.
2018/0175115 A1*   6/2018  Choi .................... H01L 27/322

FOREIGN PATENT DOCUMENTS

KR      10-0916602 B1     9/2009
KR    10-2015-0123802 A  11/2015

* cited by examiner

*Primary Examiner* — Anne M Hines
(74) *Attorney, Agent, or Firm* — Birch, Stewart, Kolasch & Birch, LLP

(57) ABSTRACT

Disclosed are a flexible color filter substrate and a flexible light emitting display apparatus including the same, in which a black matrix pattern is prevented from being formed abnormally or lost. The flexible color filter substrate includes a buffer layer on a flexible substrate, a black matrix pattern on the buffer layer to define a plurality of pixel openings, and an intermediate layer between the black matrix pattern and the buffer layer.

20 Claims, 4 Drawing Sheets

FLEXIBLE COLOR FILTER SUBSTRATE AND FLEXIBLE LIGHT EMITTING DISPLAY APPARATUS INCLUDING THE SAME

CROSS-REFERENCE TO RELATED APPLICATION

This application claims priority to and the benefit of the Korean Patent Application No. 10-2017-0108732 filed in the Republic of Korea on Aug. 28, 2017, which is hereby incorporated by reference in its entirety for all purposes as if fully set forth herein.

BACKGROUND OF THE INVENTION

Field of the Invention

The present disclosure relates to a flexible color filter substrate and a flexible light emitting display apparatus including the same.

Discussion of the Related Art

Since flexible display apparatuses may be bent or rolled like papers, the flexible display apparatuses are easy to carry and keep, and thus, are being continuously researched as next-generation display apparatuses. Examples of the flexible display apparatuses may include liquid crystal display (LCD) apparatuses, light emitting display apparatuses, electrophoretic display apparatuses, micro light emitting diode display apparatuses, electro-wetting display apparatuses, and quantum dot light emitting display apparatuses, which use a flexible substrate, such as plastic, as a base substrate.

Recently, research and development are being done on transparent flexible display apparatuses where a transmissive part is provided in a flexible display apparatus.

A related art flexible display apparatus may include a lower substrate including a pixel array layer, an upper substrate including a color filter array layer, and a transparent adhesive layer between the lower substrate and the upper substrate.

The upper substrate may include a transparent flexible substrate, a buffer layer provided on the transparent flexible substrate, a black matrix pattern which defines a pixel opening on the buffer layer, and a color filter provided in the pixel opening. In the upper substrate, the transparent flexible substrate and the buffer layer may be essential elements of the related art flexible display apparatus.

Generally, the buffer layer is formed of an inorganic material for preventing penetration of water via the transparent flexible substrate. In an instance where the black matrix pattern is provided on the buffer layer including an inorganic material, an adhesive force between the buffer layer including an inorganic material and a black matrix is reduced, and due to this, the black matrix pattern is formed in an abnormal shape or is lost. That is, since the buffer layer including an inorganic material has hydrophilicity but the black matrix pattern has hydrophobicity, the adhesive force between the buffer layer and the black matrix is reduced due to a surface energy difference between the buffer layer and the black matrix pattern, and for this reason, the black matrix pattern is formed on the buffer layer in an abnormal shape, or a portion of the black matrix pattern is lost when patterning (or developing) the black matrix pattern.

For this reason, in the related art flexible display apparatus, since the black matrix pattern is formed abnormally and lost, productivity is reduced.

SUMMARY OF THE INVENTION

Accordingly, the present disclosure is directed to provide a flexible color filter substrate and a flexible light emitting display apparatus including the same that substantially obviate one or more problems due to limitations and disadvantages of the related art.

An aspect of the present disclosure is directed to provide a flexible color filter substrate and a flexible light emitting display apparatus including the same, in which a black matrix pattern is prevented from being formed abnormally or lost.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a flexible color filter substrate including a buffer layer on a flexible substrate, a black matrix pattern on the buffer layer to define a plurality of pixel openings, an intermediate layer between the black matrix pattern and the buffer layer, and a color filter layer provided in each of the plurality of pixel opening.

In another aspect of the present disclosure, there is provided a flexible light emitting display apparatus including a lower substrate including a pixel array layer, an upper substrate including a color filter, and a transparent adhesive layer between the lower substrate and the upper substrate, wherein the upper substrate includes a buffer layer on a flexible substrate, a black matrix pattern on the buffer layer to define a plurality of pixel openings, an intermediate layer between the black matrix pattern and the buffer layer, and a color filter layer provided in each of the plurality of pixel opening.

The intermediate layer according to an embodiment of the present disclosure may include a hydrophobic material.

The buffer layer according to an embodiment of the present disclosure may include at least one inorganic layer including an inorganic material, and the intermediate layer may include an organic material.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
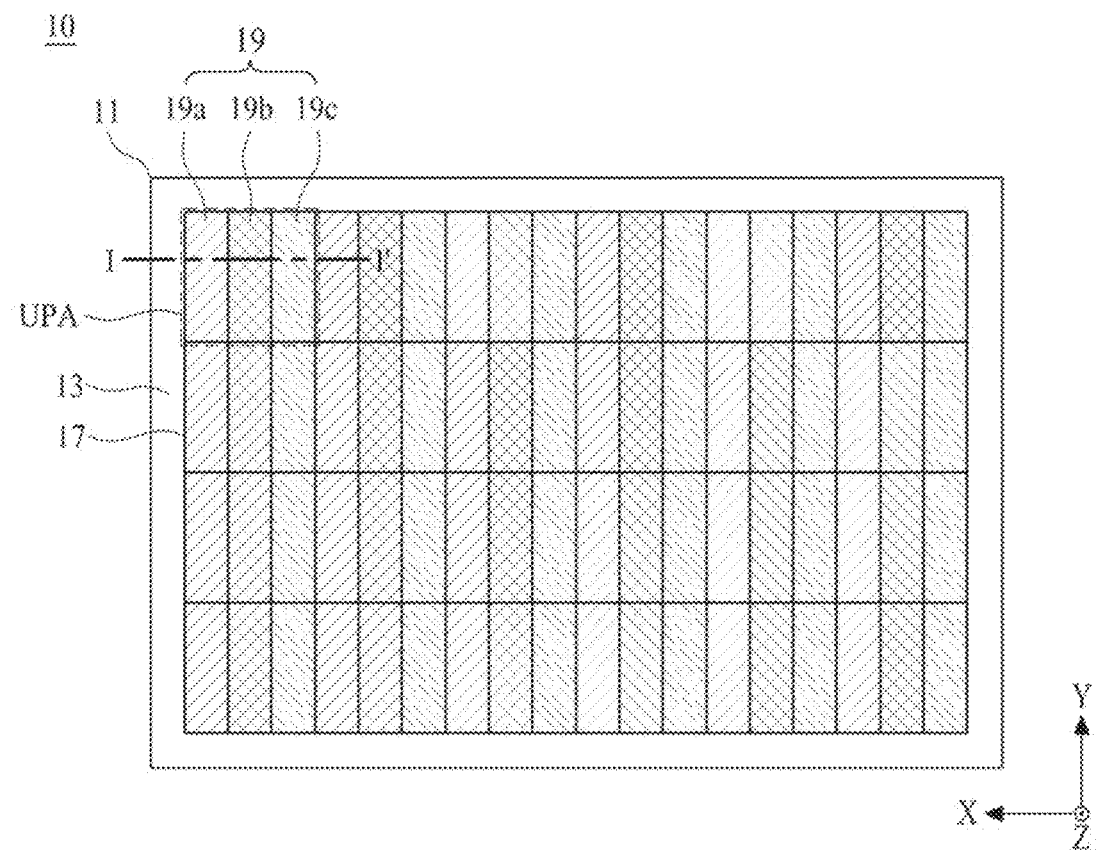
FIG. 1 is a plan view for describing a flexible color filter substrate according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In an instance where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', an instance which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a flexible color filter substrate and a flexible light emitting display apparatus according to the present disclosure will be described in detail with reference to the accompanying drawings. In adding reference numerals to elements of each of the drawings, although the same elements are illustrated in other drawings, like reference numerals may refer to like elements.

Figure 2:
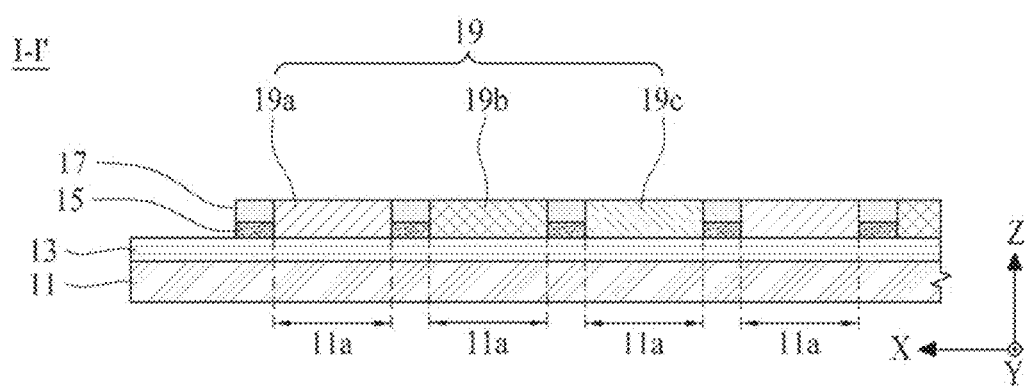
FIG. 2 is a cross-sectional view taken along line I-I' illustrated in FIG. 1.

FIG. 1 is a plan view for describing a flexible color filter substrate 10 according to an embodiment of the present disclosure, and FIG. 2 is a cross-sectional view taken along line I-I' illustrated in FIG. 1. All the components of the flexible color filter substrate according to all embodiments are operationally coupled and configured.

Referring to FIGS. 1 and 2, the flexible color filter substrate 10 according to an embodiment of the present disclosure can include a flexible substrate 11, a buffer layer 13, a black matrix pattern 17, an intermediate layer 15, and a color filter layer 19.

The flexible substrate 11 can be formed of a transparent flexible material capable of being bent or curved. The flexible substrate 11 according to an embodiment can include a transparent polyimide material, but is not limited thereto. In other embodiments, the flexible substrate 11 can be formed of a transparent plastic material such as polyethylene terephthalate. For example, the flexible substrate 11 including the transparent polyimide material can be formed by curing a polyimide resin which can be coated to have a certain thickness on a front surface of a release layer provided on a carrier glass substrate. In this instance, the carrier glass substrate can be separated from the flexible substrate 11 by releasing the release layer through a laser release process. Other transparent materials can be used The buffer layer 13 can be provided on a whole front surface of the flexible substrate 11 to prevent penetration of external water or moisture and may be referred to as a barrier layer.

The buffer layer 13 according to an embodiment can include at least one inorganic layer including an inorganic material. For example, the buffer layer 13 can include at least one inorganic material of silicon oxide (SiOx), silicon nitride (SiNx), silicon oxynitride (SiON), titanium oxide (TiOx), and aluminum oxide (AlOx). Other materials can be used.

The black matrix pattern 17 can be provided on the buffer layer 13 and can define a plurality of pixel openings 11a. In this instance, three pixel openings 11a adjacent to one another in a first direction X among the plurality of pixel openings 11a can configure one unit pixel area UPA. As shown in FIG. 1, there can be a plurality of the unit pixel areas UPAs. Also, the number of the pixel openings in each unit pixel area UPA can be greater than three (3) or may be less than three (3).

The black matrix pattern 17 according to an embodiment can include a plurality of first patterns, which are parallel to the first direction X and are spaced apart from each other in a second direction Y intersecting the first direction X, and a plurality of second patterns which are parallel to the second direction Y and are spaced apart from each other in the first direction X. Each of the plurality of pixel openings 11a can be defined as an area surrounded by a corresponding first pattern and a corresponding second pattern. Here, the first direction X can be defined as a direction parallel to a horizontal lengthwise direction of the flexible substrate 11, and the second direction Y can be defined as a direction parallel to a vertical lengthwise direction of the flexible substrate 11. However, the present embodiment is not limited thereto, and each of the first direction X and the second direction Y can be defined as a direction opposite thereto.

The black matrix pattern 17 according to an embodiment can include an opaque metal material such as chromium (Cr or CrOx), a resin material, or a light-absorbing material. Other materials can be used for the black matrix pattern 17.

The black matrix pattern 17 according to an embodiment can have a rectangular shape, a taper shape, or a reverse taper shape. A shape of the black matrix pattern 17 can be modified based on an exposing condition and a developing condition in a photolithography process of forming a black matrix. Accordingly, the shape of the black matrix pattern 17 may vary.

The intermediate layer 15 can be disposed between the black matrix pattern 17 and the buffer layer 13. The intermediate layer 15 can be disposed between the black matrix pattern 17 and the buffer layer 13, for preventing an adhesive force of the black matrix pattern 17 from being reduced when the black matrix pattern 17 directly contacts the buffer layer 13. Accordingly, the black matrix pattern 17 does not directly contact the buffer layer 13. To this end, the intermediate layer 15 can be formed of a material having hydrophobicity similar to that of the black matrix pattern 17, thereby increasing the adhesive force of the black matrix pattern 17. Other materials can be used. The intermediate layer 15 according to an embodiment can include an organic material or a fluoridation-processed organic material, which has a higher adhesive force with the black matrix pattern 17 than the buffer layer 13 including an inorganic material. For example, the intermediate layer 15 can include at least one organic material of acryl resin, epoxy resin, phenolic resin, polyamide resin, polyimide resin, benzocyclobutene resin, and fluorine resin. Other materials can be used.

The intermediate layer 15 according to an embodiment can be formed through a process of forming an organic material layer on a whole front surface of the buffer layer 13 and a patterning process (or an ashing process) using the black matrix pattern 17 as a mask. Therefore, the buffer layer 13 overlapping the plurality of pixel openings 11a can be exposed without being covered by the intermediate layer 15. Therefore, in the present embodiment, the intermediate layer 15 can be provided between the black matrix pattern 17 and the buffer layer 13, and the buffer layer 13 can be selectively exposed even without a separate process. In embodiments of the present disclosure, the intermediate layer 15 can have a thickness that is about the same as a thickness of the black matrix pattern 19, but such is not required, and the intermediate layer 15 can have a thickness that is greater than or less than a thickness of the black matrix pattern 19. Also, the intermediate layer 15 can have a width that is about the same as a width of the black matrix pattern 19 in the first direction X, such that the intermediate layer 15 and the black matrix pattern 19 overlap, but such is not required and the respective width of the intermediate layer 15 and the black matrix pattern 19 may be different.

The color filter layer 19 can be provided in each of the plurality of pixel openings 11a. In this instance, the color filter layer 19 can directly contact the buffer layer 13 overlapping each of the plurality of pixel openings 11a. However, in other embodiments, the color filter layer 19 need not directly contact the buffer layer 13.

The color filter layer 19 according to an embodiment can include a plurality of first color filters 19a, a plurality of second color filters 19b, and a plurality of third color filters 19c. Here, each of the plurality of first color filters 19a can be defined as one color filter of a red color filter, a green color filter, and a blue color filter, each of the plurality of second color filters 19b can be defined as one color filter of the other color filters, except the first color filters 19a, of the red color filter, the green color filter, and the blue color filter, and each of the plurality of third color filters 19c can be defined as the other color filter, except the first color filters 19a and the second color filters 19b, of the red color filter, the green color filter, and the blue color filter. For example, each of the first color filters 19a can be defined as a red color filter, each of the second color filters 19b can be defined as a green color filter, and each of the third color filters 19c can be defined as a blue color filter. Other color filters can be used, and the number of the color filters can vary.

The first to third color filters 19a to 19c can be alternately arranged in the first direction X. That is, the first color filter 19a can be provided in a first pixel opening among a plurality of unit pixel areas UPA defined in the first direction X, the second color filter 19b can be provided in a second pixel opening among the plurality of unit pixel areas UPA, and the third color filter 19c can be provided in a third pixel opening among the plurality of unit pixel areas UPA.

Optionally, the color filter layer 19 can include a quantum dot which re-emits light according to incident light to emit light having a predetermined color. Here, the quantum dot can be selected from among CdS, CdSe, CdTe, ZnS, ZnSe, GaAs, GaP, GaAs—P, Ga—Sb, InAs, InP, InSb, AlAs, AlP, AlSb, etc. For example, the first color filters 19a can each include a quantum dot of CdSe or InP which emits red light, the second color filters 19b can each include a quantum dot of CdZnSeS which emits green light, and the third color filters 19c can each include a quantum dot of ZnSe which emits blue light. As described above, when the color filter layer 19 includes the quantum dot, a color reproduction rate increases. Other materials can be used, including other luminescent materials. In embodiments of the present disclosure, the intermediate layer 15 and the black matrix pattern 19 together can have a thickness the same as a thickness of the color filter layer 19, but such is not required. Accordingly, the intermediate layer 15 and the black matrix pattern 19 together can have a thickness greater than or less than a thickness of the color filter layer 19.

In the flexible color filter substrate 10 according to the present embodiment, an adhesive force of the black matrix pattern 17 increases due to the intermediate layer 15 including a hydrophobic material disposed between the buffer layer 13 and the black matrix pattern 17, and thus, the black matrix pattern 17 can be prevented from being formed abnormally and lost when patterning the black matrix pattern 17, thereby increasing productivity. Materials having characteristics other than hydrophobicity can be used.

Figure 3:
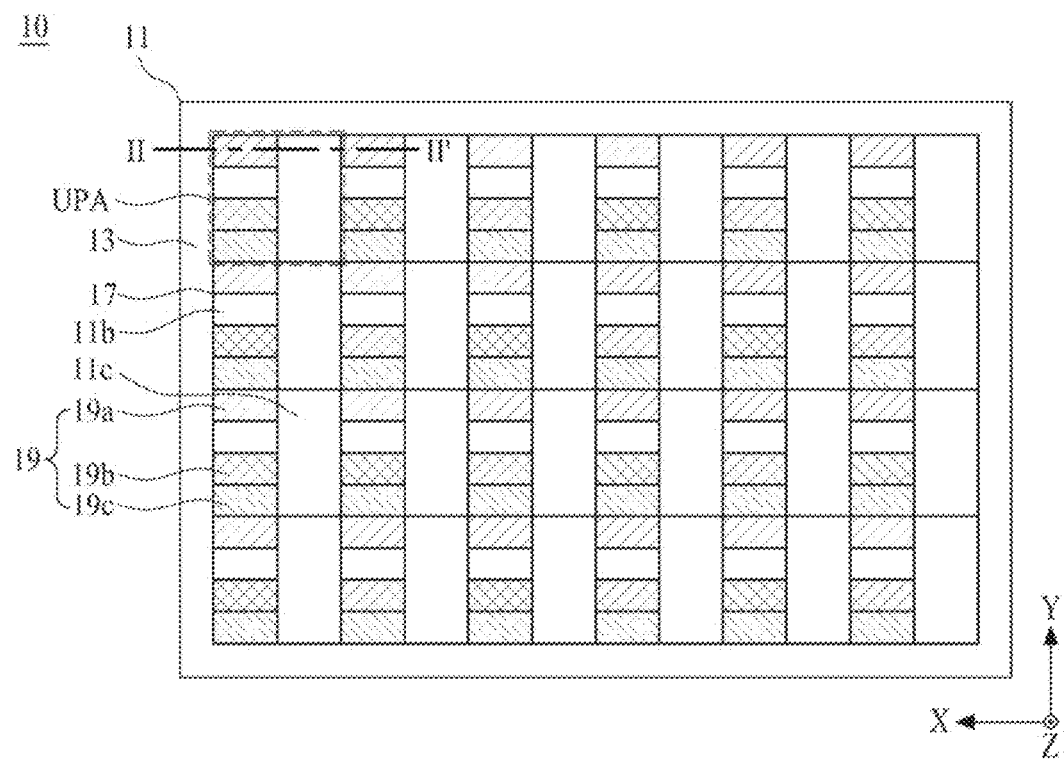
FIG. 3 is a plan view for describing a flexible color filter substrate according to an embodiment of the present disclosure.
Figure 4:
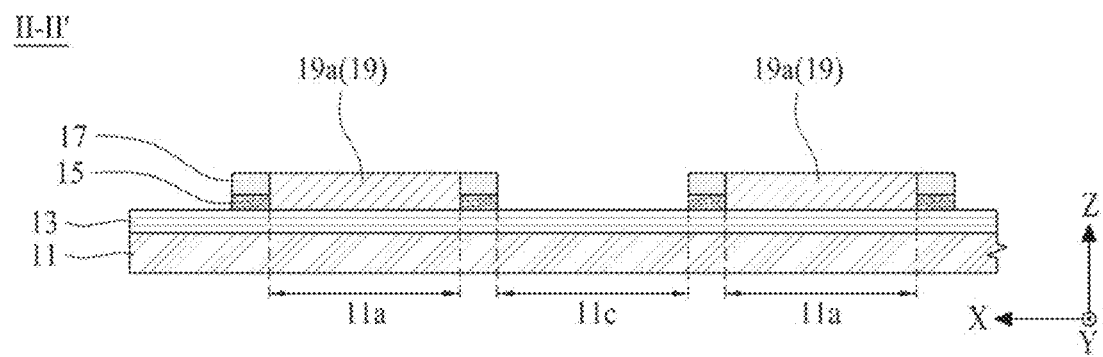
FIG. 4 is a cross-sectional view taken along line II-II' illustrated in FIG. 3.

FIG. 3 is a plan view for describing a flexible color filter substrate according to an embodiment of the present disclosure, and FIG. 4 is a cross-sectional view taken along line II-II' illustrated in FIG. 3. FIGS. 3 and 4 illustrate an example where a white opening and a transmissive part are additionally provided in a unit pixel area illustrated in FIGS. 1 and 2. Therefore, in the following description, only a white opening, a transmissive part, and elements relevant thereto will be described, and description of the other same elements will be briefly given or are omitted.

Referring to FIGS. 3 and 4, the flexible color filter substrate 10 according to the present embodiment can further include a plurality of white openings 11b defined by the black matrix pattern 17. All the components of the flexible color filter substrate according to all embodiments are operationally coupled and configured.

Each of the plurality of white openings 11b can be provided in each of the unit pixel areas UPA, thereby increasing a white luminance of each of the unit pixel areas UPA. As shown in FIG. 3, there can be a plurality of the unit pixel areas UPAs.

For example, in each of the unit pixel areas UPA, each of the white openings 11b can be defined as one of four adjacent openings 11a. Each of the plurality of white openings 11b need not include the above-described color filters. That is, the color filter layer 19 can be provided in the other pixel openings 11a except the plurality of white openings 11b. Therefore, the plurality of white openings 11b can each include only the buffer layer 13, and thus, the buffer layer 13 overlapping the plurality of white openings 11b can be exposed without being covered by the intermediate layer 15 and color filter layer 19.

Three pixel openings 11a and one white opening 11b which configure on unit pixel area UPA can be disposed adjacent to one another along the second direction Y, or can be disposed adjacent to one another along the first direction X. Also, the number of the pixel openings in each unit pixel area UPA can be greater than four (4).

The flexible color filter substrate 10 according to the present embodiment can include a plurality of transmissive parts 11c defined by the black matrix pattern 17.

Each of the plurality of transmissive parts 11c can be provided in a corresponding unit pixel area of the unit pixel areas UPA, and thus, a portion of each of the unit pixel areas UPA can be transparent, thereby increasing a transparency of each of the unit pixel areas UPA.

For example, in each of the unit pixel areas UPA, the transmissive part 11c can be provided adjacent to and in parallel to four adjacent pixel openings included in a corresponding unit pixel area UPA to achieve an optimized optical quality. In this instance, a size of the transmissive part 11c can be set to half of a size of each of the unit pixel areas UPA, but can vary based on transparency set in each of the unit pixel areas UPA without being limited thereto. To this end, each of the plurality of transmissive parts 11c need not include the above-described color filter. That is, the color filter layer 19 can be provided in the other pixel openings 11a except the plurality of transmissive parts 11c. Therefore, the plurality of transmissive parts 11c can each include only the buffer layer 13, and thus, the buffer layer 13 overlapping the plurality of white openings 11b can be exposed without being covered by the intermediate layer 15 and color filter layer 19.

Optionally, in FIGS. 3 and 4, the white opening 11b and the transmissive part 11c are illustrated as being provided in each of the unit pixel areas UPA, but are not limited thereto. In other embodiments, each of the unit pixel areas UPA according to the present disclosure can include at least one of the white opening 11b and the transmissive part 11c. For example, each of the unit pixel areas UPA can include the white opening 11b, and in this instance, the color filter layer 19 can be provided in the other pixel openings except the white openings. As another example, each of the unit pixel areas UPA can include the transmissive part 11c, and in this instance, the color filter layer 19 can be provided in the other pixel openings except the transmissive parts.

In the flexible color filter substrate 10 according to the present embodiment, an adhesive force of the black matrix pattern 17 increases due to the intermediate layer 15 including a hydrophobic material disposed between the buffer layer 13 and the black matrix pattern 17, and thus, the black matrix pattern 17 can be prevented from being formed abnormally and lost when patterning the black matrix pattern 17, thereby increasing productivity. Also, the flexible color filter substrate 10 according to the present embodiment can have transparency due to the transmissive part 11c provided in each of the unit pixel areas UPA, and thus, can be a color filter substrate of a transparent flexible display apparatus.

Figure 5A:
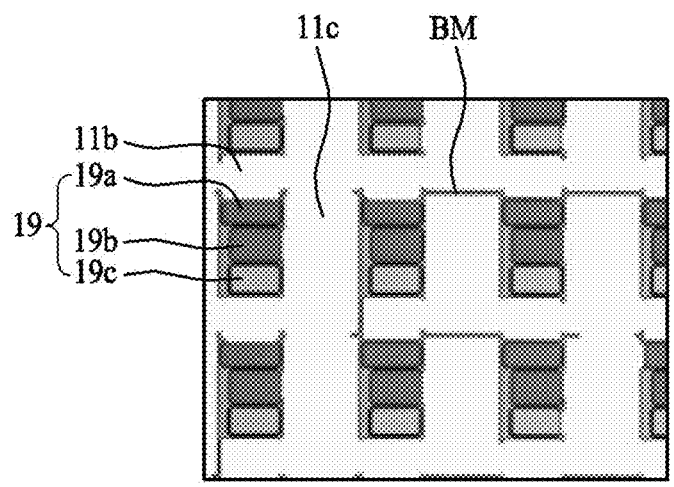
FIG. 5A is a microscope photograph showing a state where a black matrix pattern according to a comparative example is formed.
Figure 5B:
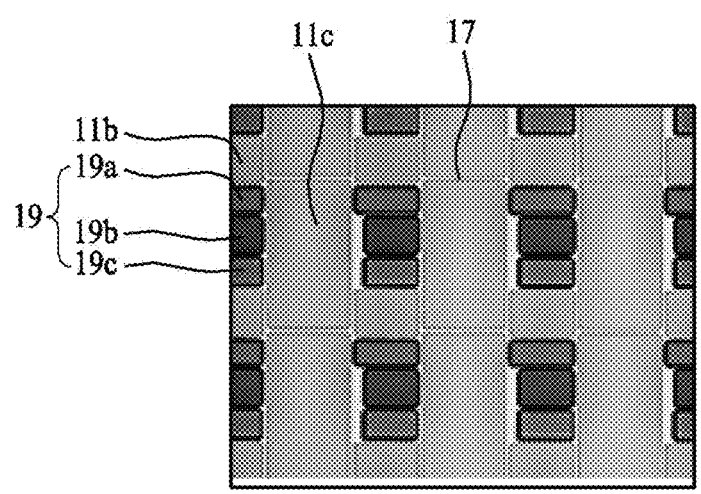
FIG. 5B is a microscope photograph showing a state where a black matrix pattern is formed with respect to the flexible color filter substrate illustrated in FIGS. 3 and 4.

FIG. 5A is a microscope photograph showing a state where a black matrix pattern according to a comparative example is formed, and FIG. 5B is a microscope photograph showing a state where a black matrix pattern can be formed with respect to the flexible color filter substrate illustrated in FIGS. 3 and 4.

As shown in FIG. 5A, in the comparative example, it can be seen that since a black matrix pattern BM can be directly provided on a buffer layer including an inorganic material, an adhesive force between the buffer layer and the black matrix pattern BM can be reduced due to a surface energy difference between the buffer layer including an inorganic material and the black matrix pattern BM, and for this reason, a portion of the black matrix pattern BM defining each of a white opening 11b and a transmissive part 11c can be not formed and can be lost.

On the other hand, as shown in FIG. 5B, it can be seen that in the present disclosure, since an intermediate layer including hydrophobicity can be disposed between a black matrix pattern 17 and a buffer layer including an inorganic material, an adhesive force between the intermediate layer and the black matrix pattern 17 increases, and thus, the black matrix pattern 17 can be formed to have a normal shape.

Therefore, in the flexible color filter substrate 10 according to the present embodiment, the black matrix pattern 17 can be prevented from being formed abnormally and lost when patterning the black matrix pattern 17, thereby increasing productivity.

Figure 6:
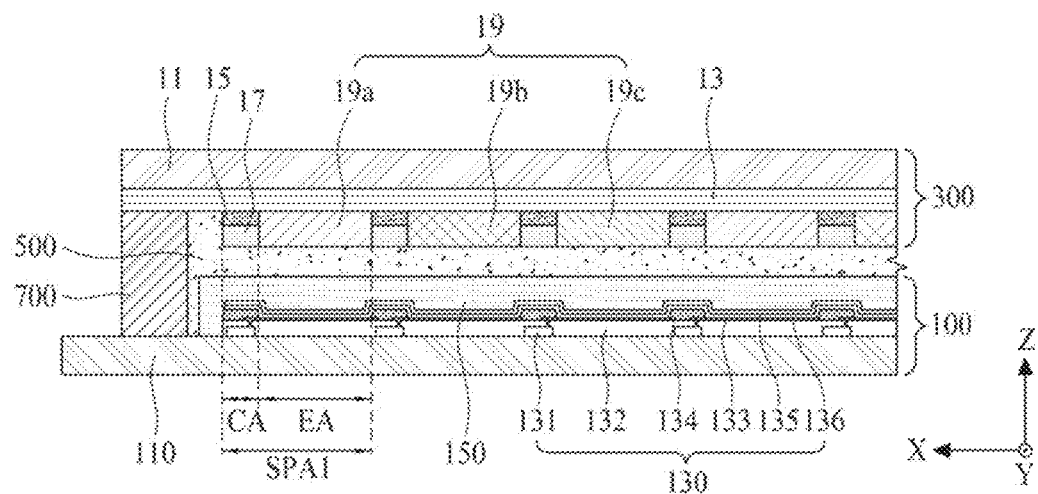
FIG. 6 is a cross-sectional view for describing a flexible display apparatus according to an embodiment of the present disclosure.

FIG. 6 is a cross-sectional view for describing a flexible display apparatus according to an embodiment of the present disclosure and illustrates an example where the flexible display apparatus is configured with the flexible color filter substrate illustrated in FIGS. 1 and 2.

Referring to FIG. 6 along with FIGS. 1 and 2, the flexible display apparatus according to an embodiment of the present disclosure can include a lower substrate 100, an upper substrate 300, and a transparent adhesive layer 500. All the components of the flexible display apparatus according to all embodiments are operationally coupled and configured.

The lower substrate 100 can be defined as a thin film transistor (TFT) array substrate. The lower substrate 100 according to an embodiment can include a first flexible substrate 110 and a pixel array layer 130.

The first flexible substrate 110 can be formed of an opaque flexible material capable of being bent or curved. The first flexible substrate 110 according to an embodiment can include an opaque polyimide material, but is not limited thereto. In other embodiments, the first flexible substrate 110 can be formed of an opaque plastic material. For example, the first flexible substrate 110 including the opaque polyimide material can be formed by curing a polyimide resin which can be coated to have a certain thickness on a front surface of a first release layer provided on a first carrier glass substrate. The first carrier glass substrate can be separated from the first flexible substrate 110 by releasing the first release layer through a laser release process which can be performed after a process of bonding the lower substrate 100 to the upper substrate 300 by using the transparent adhesive layer 500.

The first flexible substrate 110 can include a display area and a non-display area surrounding the display area. The non-display area can be provided in an edge of the first flexible substrate 110.

The display area of the first flexible substrate 110 can include a plurality of unit pixel areas.

The plurality of unit pixel areas can each include a pixel area PA including an emission area EA and a circuit area CA. A plurality of pixel areas PA can be included.

The plurality of unit pixel areas according to an embodiment can each include a first subpixel area SPA1, a second subpixel area, and a third subpixel area which are disposed adjacent to one another along a first direction X. Each of the first subpixel area SPA1, the second subpixel area, and the third subpixel area can include a circuit area CA and an emission area EA. For example, the first subpixel area SPA1 can be defined as a red subpixel, the second subpixel area can be defined as a green subpixel, and the third subpixel area can be defined as a blue subpixel. Other colors can be used.

The plurality of unit pixel areas according to an embodiment can each include a first subpixel area SPA1, a second subpixel area, a third subpixel area, and a fourth subpixel area which are disposed adjacent to one another along a first direction X. Additional subpixel areas can be used. Each of the first subpixel area SPA1, the second subpixel area, the third subpixel area, and the fourth subpixel area can include a circuit area CA and an emission area EA. For example, the first subpixel area SPA1 can be defined as a red subpixel, the second subpixel area can be defined as a white subpixel, the third subpixel area can be defined as a blue subpixel, and the fourth subpixel area can be defined as a green subpixel.

Optionally, a buffer layer can be provided on a front surface of the first flexible substrate 110. The buffer layer can be provided on the whole front surface of the first flexible substrate 110, for preventing water from penetrating into the pixel array layer 130 via the first flexible substrate 110. The buffer layer according to an embodiment can include at least one inorganic layer including an inorganic material. For example, the buffer layer can include at least one inorganic material of $SiO_x$, $SiN_x$, SiON, $TiO_x$, and $AlO_x$. Other materials can be used. The buffer layer can be omitted.

The pixel array layer 130 can be provided in the display area provided on the first flexible substrate 110. The pixel array layer 130 according to an embodiment can include a plurality of gate lines, a plurality of data lines, a plurality of driving power lines, a pixel driving circuit 131, an insulation layer 132, a plurality of pixel electrodes 133, a bank pattern 134, a light emitting device layer 135, and a common electrode 136.

The gate lines can be provided on the first flexible substrate 110, can be parallel to the first direction X of the first flexible substrate 110, and can be spaced apart from one another along a second direction Y of the first flexible substrate 110. The gate lines can be covered by a gate insulation layer.

The data lines can be provided on the gate insulation layer on the first flexible substrate 110, can be parallel to the second direction Y of the first flexible substrate 110, and can be spaced apart from one another along the first direction X of the first flexible substrate 110.

The driving power lines can be provided on the gate insulation layer in parallel with the data lines.

The pixel driving circuit 131 can be provided in the circuit area CA provided in each of a plurality of subpixel areas defined by intersections of the gate lines and the data lines, and can include at least one switching thin film transistor (TFT), one driving TFT, and at least one storage capacitor. The pixel driving circuit 131 can allow the light emitting device layer 135 to emit light, based on a gate signal supplied through an adjacent gate line, a driving power supplied through an adjacent driving power line, and a data signal supplied through an adjacent data line. Additional TFT's can be used.

The insulation layer 132 can be provided on the first flexible substrate 110 to cover the pixel driving circuit 131 provided in plurality, the data lines, and the driving power lines. The insulation layer 132 according to an embodiment can include at least one inorganic material of $SiO_x$, $SiN_x$, SiON, $TiO_x$, and $AlO_x$. Other materials can be used. The insulation layer 132 can be referred to as a passivation layer.

The plurality of pixel electrodes 133 can be individually patterned in a plurality of subpixel areas and can be referred to as an anode electrode of the light emitting device layer 135. Each of the plurality of pixel electrodes 133 can be electrically connected to the driving TFT of a corresponding driving circuit 131 through a contact hole provided in the insulation layer 132 overlapping a corresponding subpixel area. Each of the plurality of pixel electrodes 133 can include a metal material, which can be high in reflectivity. For example, each of the plurality of pixel electrodes 133 can be formed in a multilayer structure such as a stacked structure (Ti/Al/Ti) of Al and Ti, a stacked structure (ITO/Al/ITO) of Al and indium tin oxide (ITO), an APC (Ag/Pd/Cu) alloy, or a stacked structure (ITO/APC/ITO) of an APC alloy and ITO, or can include a single-layer structure including one material or two or more alloy materials selected from among silver (Ag), aluminum (Al), molybdenum (Mo), gold (Au), magnesium (Mg), calcium (Ca), and barium (Ba). Other materials can be used.

The bank pattern 134 can define an emission area EA in each of the plurality of subpixel areas and can be referred to as a pixel defining layer (or an isolation layer). The bank pattern 134 can be provided in an edge of each of the plurality of pixel electrodes 133 and on the insulation layer 132 to overlap a circuit area CA in each of the plurality of subpixel areas and can define the emission area EA in each of the plurality of subpixel areas. For example, the bank pattern 134 can include at least one organic material of acryl resin, epoxy resin, phenolic resin, polyamide resin, polyimide resin, benzocyclobutene resin, and fluorine resin. As another example, the bank pattern 134 can be formed of a photosensitive material including a black pigment, and in this instance, the bank pattern 134 can act as a light blocking pattern.

The light emitting device layer 135 can be provided on the plurality of pixel electrodes 133. The light emitting device layer 135 according to an embodiment can include two or more light emitting parts for emitting white light. For example, the light emitting device layer 135 can include a first light emitting part and a second light emitting part for emitting the white light based on a combination of first light and second light. Here, the first light emitting part can emit the first light and can include one of a blue light emitting part, a green light emitting part, a red light emitting part, a yellow light emitting part, and a yellow-green light emitting part. The second light emitting part can include a light emitting part emitting light having a complementary color relationship of the first light among a blue light emitting part, a green light emitting part, a red light emitting part, a yellow light emitting part, and a yellow-green emitting part. The light emitting device layer 135 can emit the white light, and thus, can be provided on the first flexible substrate 110 to cover the plurality of pixel electrodes 133 and the bank pattern 134, without being individually patterned in each of the plurality of subpixel areas.

The common electrode 136 can be provided to cover the light emitting device layer 135 and can be referred to as a cathode electrode of the light emitting device layer 135. The common electrode 136 according to an embodiment can be formed of ITO or indium zinc oxide (IZO) which can be a transparent conductive material such as transparent conductive oxide (TCO), in order for light emitted from the light emitting device layer 135 to be transmitted to the upper substrate 300.

In the pixel array layer 130, the light emitting device layer 135 overlapping the emission area EA of each of the plurality of subpixel areas can emit light according to a data signal supplied from the pixel driving circuit 131 provided in each subpixel area, and thus, the light emitted from the light emitting device layer 135 can be transferred to the upper substrate 300 via the common electrode 136. Accordingly, the pixel array layer 130 (or a flexible display apparatus) according to the present embodiment can have a top emission structure.

The lower substrate 100 according to the present embodiment can further include a passivation layer 150.

The passivation layer 150 can be provided on the first flexible substrate 110 to cover the pixel array layer 130. The passivation layer 150 according to an embodiment prevents water or oxygen from penetrating into the light emitting device layer 135. The passivation layer 150 according to an embodiment can include at least one inorganic material of SiOx, SiNx, SiON, TiOx, and AlOx. Other materials can be used.

Optionally, the passivation layer 150 can further include at least one organic layer. The organic layer can be formed to have a sufficient thickness for preventing particles from penetrating into the light emitting device layer 135 via the passivation layer 150. The organic layer according to an embodiment can include at least one organic material of acryl resin, epoxy resin, phenolic resin, polyamide resin, polyimide resin, benzocyclobutene resin, and fluorine resin. Other materials can be used.

Additionally, the subpixel areas according to the present embodiment can be arranged in a pentile structure in the display area. In this instance, one unit pixel area can include one red subpixel area, two green subpixel areas, and one blue subpixel area, which are planarly arranged as a polygonal type. For example, a unit pixel area having the pentile structure can include one red subpixel area, two green subpixel areas, and one blue subpixel area, which are planarly arranged as an octagonal type. In this instance, the blue subpixel area can have a largest size, and each of the two green subpixel areas can have a smallest size. Other color subpixels of various sizes can be used.

The upper substrate 300 can be defined as a color filter array substrate. The upper substrate 300 according to an embodiment can be formed as the flexible color filter substrate 10 illustrated in FIGS. 1 and 2 and can include a second flexible substrate 11, a buffer layer 13, a black matrix pattern 17, an intermediate layer 15, and a color filter layer 19. Except for that the term "flexible color filter substrate 10" illustrated in FIGS. 1 and 2 can be changed to the term "second flexible substrate 11", elements of the upper substrate 300 are the same as those of the flexible color filter substrate 10 illustrated in FIGS. 1 and 2, and thus, their overlapping descriptions are omitted.

In the upper substrate 300, the black matrix pattern 17 can overlap the bank pattern 134 provided on the lower substrate 100, and each of a plurality of pixel openings defined by the black matrix pattern 17 can overlap an emission area EA provided in a corresponding subpixel area of a plurality of subpixel areas of the lower substrate 100. Therefore, each of a plurality of color filters 19a to 19c respectively provided in the pixel openings of the upper substrate 300 can transmit only a wavelength of a light with a color, set in a corresponding pixel, of white light incident from an overlapping emission area EA.

The second flexible substrate 11 can be formed by curing a polyimide resin which can be coated to have a certain thickness on a front surface of a second release layer provided on a second carrier glass substrate. The second carrier glass substrate can be separated from the second flexible substrate 11 by releasing the second release layer through a laser release process which can be performed after a process of bonding the lower substrate 100 to the upper substrate 300 by using a transparent adhesive layer 500.

The transparent adhesive layer 500 can be disposed between the upper substrate 300 and the lower substrate 100 and can opposite-bond the upper substrate 300 to the lower substrate 100. The transparent adhesive layer 500 can be referred to as a filler. The transparent adhesive layer 500 according to an embodiment can include a material capable of being filled into an area between the lower substrate 100 and the upper substrate 300 and can be formed of transparent epoxy capable of transmitting light, but is not limited thereto. The transparent adhesive layer 500 can be formed on the lower substrate 100 through a process such as an inkjet process, a slit coating process, or a screen printing process, but can be formed on the upper substrate 300 without being limited thereto.

When the upper substrate 300 includes a plurality of white openings which are defined by the black matrix pattern 17 to overlap a white subpixel of the lower substrate 100, the transparent adhesive layer 500 can directly contact the buffer layer 13 overlapping each of the plurality of white openings as illustrated in FIGS. 3 and 4. In this instance, the transparent adhesive layer 500 can be filled into a whole area between the upper substrate 300 and the lower substrate 100, and thus, smears caused by the insufficient filling (or a coating defect) of the transparent adhesive layer 500 are prevented, thereby increasing productivity.

Additionally, the flexible display apparatus according to the present embodiment can further include a dam pattern 700 which surrounds an outer portion of the transparent adhesive layer 500.

The dam pattern 700 can be provided in an edge of the upper substrate 300 in a closed loop form. The dam pattern 700 according to an embodiment can be provided in an edge of the buffer layer 13 provided on the upper substrate 300 to have a certain height. The dam pattern 700 can prevent the transparent adhesive layer 500 from spreading or overflowing and can bond the lower substrate 100 to the upper substrate 300. The dam pattern 700 according to an embodiment can be cured by light such as ultraviolet (UV) light and can be formed of a high-viscosity resin (for example, an epoxy material). Furthermore, the dam pattern 700 can be formed of an epoxy material including a getter material capable of adsorbing water and/or oxygen, but is not limited thereto. The dam pattern 700 can prevent external water and/or oxygen from penetrating into a space between the bonded lower substrate 100 and upper substrate 300 to protect the light emitting device layer 135 from water and/or oxygen, thereby preventing a lifetime of the light emitting device layer 135 from being reduced by water and/or oxygen and increasing the reliability of the light emitting device layer 135.

As described above, since the flexible display apparatus according to the present embodiment includes the flexible color filter substrate illustrated in FIGS. 1 and 2, the black matrix pattern 17 can be prevented from being formed abnormally and lost when patterning the black matrix pattern 17, thereby increasing productivity. Also, in the flexible display apparatus according to the present embodiment, an external light reflection area based on the buffer layer 13 overlapping the black matrix pattern 17 can be reduced due to the intermediate layer 15 between the buffer layer 13 including an inorganic material and the black matrix pattern 17.

Figure 7:
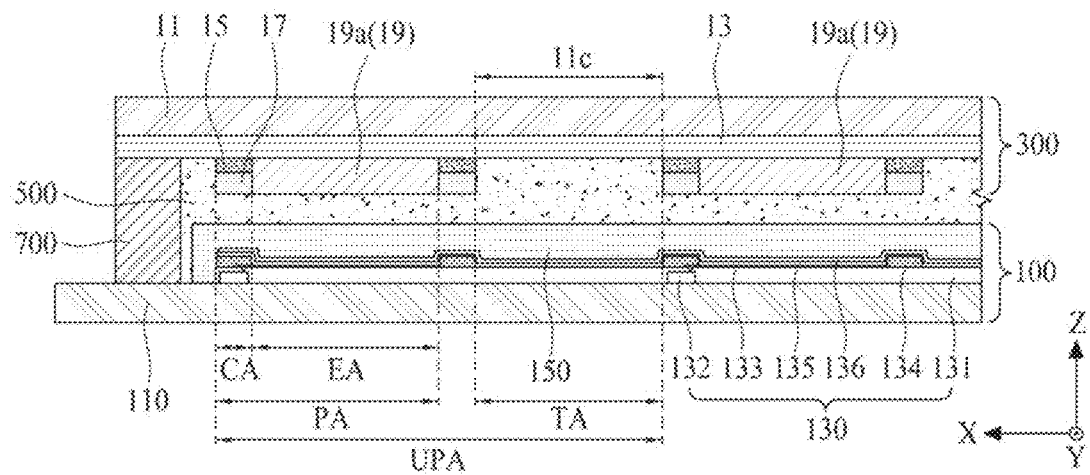
FIG. 7 is a cross-sectional view for describing a flexible display apparatus according to an embodiment of the present disclosure.

FIG. 7 is a cross-sectional view for describing a flexible display apparatus according to an embodiment of the present disclosure and illustrates an example where the flexible display apparatus is configured with the flexible color filter substrate illustrated in FIGS. 3 and 4.

Referring to FIG. 7 along with FIGS. 3 and 4, the flexible display apparatus according to the present embodiment can include a lower substrate 100, an upper substrate 300, and a transparent adhesive layer 500. All the components of the flexible display apparatus according to all embodiments are operationally coupled and configured.

The lower substrate 100 can be defined as a TFT array substrate. The lower substrate 100 according to an embodiment can include a first flexible substrate 110 and a pixel array layer 130.

The first flexible substrate 110 can include a display area and a non-display area surrounding the display area. The non-display area can be provided in an edge of the first flexible substrate 110.

The display area of the first flexible substrate 110 can include a plurality of unit pixel areas UPA. The plurality of unit pixel areas UPA can each include a pixel area PA and a transmissive area TA.

One pixel area PA according to an embodiment can include first to third subpixel areas which are disposed adjacent to one another along a second direction Y. Each of the first to third subpixel areas can include a circuit area CA and an emission area EA. For example, the first subpixel area can be defined as a red subpixel, the second subpixel area can be defined as a green subpixel, and the third subpixel area can be defined as a blue subpixel.

One pixel area PA according to another embodiment can include first to fourth subpixel areas which are disposed adjacent to one another along the second direction Y. Each of the first to fourth subpixel areas can include a circuit area CA and an emission area EA. For example, the first subpixel area can be defined as a red subpixel, the second subpixel area can be defined as a white subpixel, the third subpixel area can be defined as a blue subpixel, and the fourth subpixel area can be defined as a green subpixel.

The transmissive area TA can be provided adjacent to the pixel area PA. In this instance, a size of the transmissive area TA can be set to half of a size of each of the unit pixel areas UPA to achieve an optimized optical quality, but can vary based on transparency set in each of the unit pixel areas UPA without being limited thereto.

Optionally, the above-described buffer layer can be formed or need not be formed on a front surface of the first flexible substrate 10.

The pixel array layer 130 can be provided in the display area provided on the first flexible substrate 110. The pixel array layer 130 according to an embodiment can include a plurality of gate lines, a plurality of data lines, a plurality of driving power lines, a pixel driving circuit 131, an insulation layer 132, a plurality of pixel electrodes 133, a bank pattern 134, a light emitting device layer 135, and a common electrode 136. Except for that the pixel driving circuit 131 can be provided in the circuit area CA defined in the pixel area PA of each of the plurality of unit pixel areas UPA defined by intersections of the gate lines and the data lines, the pixel array layer 130 including the elements can be the same as the pixel array layer 130 illustrated in FIG. 6, and thus, its overlapping description is omitted. Therefore, since the pixel driving circuit 131 can be not provided in the transmissive area TA defined in the pixel area PA of each of the plurality of unit pixel areas UPA, the pixel array layer 130 according to the present embodiment can have transparency, based on the transmissive area TA defined in each of the plurality of unit pixel areas UPA.

In the pixel array layer 130, the light emitting device layer 135 overlapping the emission area EA of each of the plurality of pixel areas PA can emit light according to a data signal supplied from the pixel driving circuit 131 provided in each pixel area PA, and thus, the light emitted from the light emitting device layer 135 can be transferred to the upper substrate 300 via the common electrode 136. Accordingly, the pixel array layer 130 (or a flexible display apparatus) according to the present embodiment can have a top emission structure. Also, in a transmission mode of the flexible display apparatus, the pixel array layer 130 can have transparency based on the transmissive area TA provided in each of the unit pixel areas UPA.

The lower substrate 100 according to the present embodiment can further include the above-described passivation layer 150, and the passivation layer 150 can further include the above-described at least one organic layer.

The upper substrate 300 can be defined as a color filter array substrate. The upper substrate 300 according to an embodiment can be formed as the flexible color filter substrate 10 illustrated in FIGS. 3 and 4 and can include a second flexible substrate 11, a buffer layer 13, a black matrix pattern 17, an intermediate layer 15, and a color filter layer 19. Except for that the term "flexible color filter substrate 10" illustrated in FIGS. 3 and 4 is changed to the term "second flexible substrate 11", elements of the upper substrate 300 are the same as those of the flexible color filter substrate 10 illustrated in FIGS. 3 and 4, and thus, their overlapping descriptions are omitted.

In the upper substrate 300, the black matrix pattern 17 can overlap the bank pattern 134 provided on the lower substrate 100, and each of a plurality of pixel openings defined by the black matrix pattern 17 can overlap an emission area EA provided in a corresponding pixel area of the pixel areas PA of the lower substrate 100. Therefore, each of a plurality of color filters 19a to 19c respectively provided in the pixel openings of the upper substrate 300 can transmit only a wavelength of a light with a color, set in a corresponding pixel, of white light incident from an overlapping emission area EA.

Moreover, in the upper substrate 300, the plurality of transmissive parts 11c defined by the black matrix pattern 17 can overlap the transmissive area TA provided in each of the unit pixel areas UPA of the lower substrate 100. Therefore, in the transmission mode, the flexible display apparatus can have transparency based on the transmissive area TA of the lower substrate 100 and the transmissive part 11c of the upper substrate 300, which overlap each other.

The second flexible substrate 11 can be formed by curing a polyimide resin which can be coated to have a certain thickness on a front surface of a second release layer provided on a second carrier glass substrate. The second carrier glass substrate can be separated from the second flexible substrate 11 by releasing the second release layer through a laser release process which can be performed after a process of bonding the lower substrate 100 to the upper substrate 300 by using a transparent adhesive layer 500.

The transparent adhesive layer 500 can be disposed between the upper substrate 300 and the lower substrate 100 and can opposite-bond the upper substrate 300 to the lower substrate 100. The transparent adhesive layer 500 can be referred to as a filler. The transparent adhesive layer 500 according to an embodiment can include a material capable of being filled into an area between the lower substrate 100 and the upper substrate 300 and can be formed of transparent epoxy capable of transmitting light, but is not limited thereto. The transparent adhesive layer 500 can be formed on the lower substrate 100 through a process such as an inkjet process, a slit coating process, or a screen printing process, but can be formed on the upper substrate 300 without being limited thereto.

The transparent adhesive layer 500 can be filled into the transmissive part 11c of the upper substrate 300 and can directly contact the buffer layer 13 overlapping the transmissive part 11c of the upper substrate 300. In this instance, the transparent adhesive layer 500 can be formed of a material having hydrophilicity, and the buffer layer 13 can also be formed of a material having hydrophilicity, whereby an adhesive force between the transparent adhesive layer 500 and the buffer layer 13 increases. Therefore, the transparent adhesive layer 500 can be filled into a whole area between the upper substrate 300 and the lower substrate 100, and thus, smears caused by the insufficient filling (or a coating defect) of the transparent adhesive layer 500 are prevented.

Additionally, the flexible display apparatus according to the present embodiment can further include a dam pattern 700 which surrounds an outer portion of the transparent adhesive layer 500. The dam pattern 700 can be provided in an edge of the upper substrate 300 in a closed loop form, can prevent the transparent adhesive layer 500 from spreading or overflowing, and can bond the lower substrate 100 to the upper substrate 300. The dam pattern 700 can prevent external water and/or oxygen from penetrating into a space between the bonded lower substrate 100 and upper substrate 300 to protect the light emitting device layer 135 from water and/or oxygen, thereby preventing a lifetime of the light emitting device layer 135 from being reduced by water and/or oxygen and increasing the reliability of the light emitting device layer 135.

Since the flexible light emitting display apparatus according to the present embodiment includes the flexible color filter substrate illustrated in FIGS. 3 and 4, the black matrix pattern 17 can be prevented from being formed abnormally or lost when patterning the black matrix pattern 17, and the transparent adhesive layer 500 can be filled into a whole area between the upper substrate 300 and the lower substrate 100. Accordingly, smears caused by the insufficient filling (or a coating defect) of the transparent adhesive layer 500 are prevented, and thus, productivity increases.

A flexible light emitting display apparatus according to an embodiment of the present disclosure can include a lower substrate including a pixel array layer, an upper substrate including a color filter, and a transparent adhesive layer disposed between the lower substrate and the upper substrate, wherein the upper substrate can include a buffer layer on a flexible substrate, a black matrix pattern on the buffer layer to define a plurality of pixel openings, and an intermediate layer between the black matrix pattern and the buffer layer.

In an embodiment of the present disclosure, the pixel array layer can include a plurality of unit pixel areas each including first to fourth subpixel areas each including a circuit area and an emission area, each of the plurality of pixel openings defined on the upper substrate can overlap the emission area of each of the first to third subpixel areas, the upper substrate can further include a plurality of white openings defined by the black matrix pattern to overlap the emission area of the fourth subpixel area in each of the plurality of unit pixel areas, and the color filter layer can be in other pixel openings except the plurality of white openings.

In an embodiment of the present disclosure, the transparent adhesive layer can directly contact the buffer layer overlapping each of the plurality of white openings.

In an embodiment of the present disclosure, each of the plurality of unit pixel areas defined by the pixel array layer can further include a transmissive area adjacent to the first to fourth subpixel areas, the upper substrate can further include a plurality of transmissive parts defined by the black matrix pattern to overlap the transmissive area in each of the plurality of unit pixel areas, and the color filter layer can be in other pixel openings except the plurality of transmissive parts.

In an embodiment of the present disclosure, the transparent adhesive layer can directly contact the buffer layer overlapping each of the plurality of transmissive parts.

In an embodiment of the present disclosure, the pixel array layer can include a plurality of unit pixel areas each including first to third subpixel areas each including a circuit area and an emission area and a transmissive area adjacent to the first to third subpixel areas, each of the plurality of pixel openings defined on the upper substrate can overlap the emission area of each of the first to third subpixel areas, the upper substrate can further include a plurality of transmissive parts defined by the black matrix pattern to overlap the transmissive area in each of the plurality of unit pixel areas, and the color filter layer can be in other pixel openings except the plurality of transmissive parts.

In an embodiment of the present disclosure, the transparent adhesive layer can directly contact the buffer layer overlapping each of the plurality of transmissive parts.

A flexible color filter substrate according to an embodiment of the present disclosure include: a flexible substrate; a buffer layer on the flexible substrate; a black matrix pattern on the buffer layer to define a plurality of pixel openings, the black matrix pattern not directly contacting the buffer layer; and a color filter layer in each of the plurality of pixel openings.

As described above, in the flexible color filter substrate and the flexible light emitting display apparatus including the same according to the embodiments of the present disclosure, the black matrix pattern can be prevented from being formed abnormally or lost when patterning the black matrix pattern, and the transparent adhesive layer can be filled into a whole area between the upper substrate and the lower substrate. Accordingly, smears caused by the insufficient filling (or a coating defect) of the transparent adhesive layer are prevented, and thus, productivity increases.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A flexible color filter substrate comprising:
   a flexible substrate;
   a buffer layer on the flexible substrate;
   a black matrix pattern on the buffer layer to define a plurality of pixel openings;
   an intermediate layer between the black matrix pattern and the buffer layer; and
   a color filter layer in each of the plurality of pixel openings,
   wherein the color filter layer directly contacts the buffer layer overlapping each of the plurality of pixel openings.

2. The flexible color filter substrate of claim 1, wherein the intermediate layer comprises a hydrophobic material.

3. The flexible color filter substrate of claim 1, wherein the buffer layer comprises at least one inorganic layer including an inorganic material, and
   wherein the intermediate layer comprises an organic material.

4. The flexible color filter substrate of claim 3, wherein the intermediate layer comprises at least one organic material of acryl resin, epoxy resin, phenolic resin, polyamide resin, polyimide resin, benzocyclobutene resin, and fluorine resin.

5. The flexible color filter substrate of claim 3, wherein the intermediate layer comprises a fluoridation-processed organic material.

6. The flexible color filter substrate of claim 1, further comprising a plurality of white openings defined by the black matrix pattern, each of the plurality of white openings being an opening that is exposed without being covered by the intermediate layer and the color filter layer,
   wherein three adjacent pixel openings of the plurality of pixel openings configure one unit pixel area,
   wherein each of the plurality of white openings is in a corresponding unit pixel area of a plurality of unit pixel areas, and
   wherein the color filter layer is in other pixel openings except the plurality of white openings.

7. The flexible color filter substrate of claim 6, further comprising a plurality of transmissive parts defined by the black matrix pattern,
   wherein each of the plurality of transmissive parts is in a corresponding unit pixel area of the plurality of unit pixel areas, and
   wherein the color filter layer is in other pixel openings except the plurality of transmissive parts.

8. The flexible color filter substrate of claim 1, further comprising a plurality of transmissive parts defined by the black matrix pattern,
   wherein three adjacent pixel openings of the plurality of pixel openings configure one unit pixel area,
   wherein each of the plurality of transmissive parts is in a corresponding unit pixel area of a plurality of unit pixel areas, and
   wherein the color filter layer is in other pixel openings except the plurality of transmissive parts.

9. A flexible light emitting display apparatus comprising:
   a lower substrate including a pixel array layer;
   an upper substrate including a color filter; and
   a transparent adhesive layer between the lower substrate and the upper substrate,
   wherein the upper substrate includes the flexible color filter substrate of claim 1.

10. The flexible light emitting display apparatus of claim 9, wherein the pixel array layer comprises a plurality of unit pixel areas each including first to fourth subpixel areas each including a circuit area and an emission area,
    wherein each of the plurality of pixel openings defined on the upper substrate overlaps the emission area of each of the first to third subpixel areas,
    wherein the upper substrate further comprises a plurality of white openings defined by the black matrix pattern to overlap the emission area of the fourth subpixel area in each of the plurality of unit pixel areas, each of the plurality of white openings being an opening that is exposed without being covered by the intermediate layer and the color filter layer, and
    wherein the color filter layer is provided in other pixel openings except the plurality of white openings.

11. The flexible light emitting display apparatus of claim 10, wherein the transparent adhesive layer directly contacts the buffer layer overlapping each of the plurality of white openings.

12. The flexible light emitting display apparatus of claim 10, wherein each of the plurality of unit pixel areas defined by the pixel array layer further comprises a transmissive area adjacent to the first to fourth subpixel areas,
    wherein the upper substrate further comprises a plurality of transmissive parts defined by the black matrix pattern to overlap the transmissive area provided in each of the plurality of unit pixel areas, and
    wherein the color filter layer is in other pixel openings except the plurality of transmissive parts.

13. The flexible light emitting display apparatus of claim 12, wherein the transparent adhesive layer directly contacts the buffer layer overlapping each of the plurality of transmissive parts.

14. The flexible light emitting display apparatus of claim 9, wherein the pixel array layer comprises a plurality of unit pixel areas each including first to third subpixel areas, each including a circuit area and an emission area, and a transmissive area adjacent to the first to third subpixel areas,
    wherein each of the plurality of pixel openings defined on the upper substrate overlaps the emission area of each of the first to third subpixel areas,
    wherein the upper substrate further comprises a plurality of transmissive parts defined by the black matrix pattern to overlap the transmissive area provided in each of the plurality of unit pixel areas, and
    wherein the color filter layer is in other pixel openings except the plurality of transmissive parts.

15. The flexible light emitting display apparatus of claim 14, wherein the transparent adhesive layer directly contacts the buffer layer overlapping each of the plurality of transmissive parts.

16. A flexible color filter substrate comprising:
a flexible substrate;
a buffer layer on the flexible substrate;
a black matrix pattern on the buffer layer to define a plurality of pixel openings, the black matrix pattern not directly contacting the buffer layer; and
a color filter layer in each of the plurality of pixel openings,
wherein the color filter layer directly contacts the buffer layer overlapping each of the plurality of pixel openings.

17. The flexible color filter substrate of claim 16, further comprising an intermediate layer between the black matrix pattern and the buffer layer.

18. The flexible color filter substrate of claim 17, wherein the intermediate layer comprises a hydrophobic material.

19. The flexible color filter substrate of claim 17, wherein the buffer layer comprises at least one inorganic layer including an inorganic material, and wherein the intermediate layer comprises an organic material.

20. A flexible color filter substrate comprising:
a flexible substrate;
a buffer layer on the flexible substrate;
a black matrix pattern on the buffer layer to define a plurality of pixel openings;
an intermediate layer between the black matrix pattern and the buffer layer; and
a color filter layer in each of the plurality of pixel openings,
wherein the buffer layer comprises at least one inorganic layer including an inorganic material, and
wherein the intermediate layer comprises an organic material.

* * * * *